(12) United States Patent
Chang et al.

(10) Patent No.: US 9,217,207 B2
(45) Date of Patent: Dec. 22, 2015

(54) METHOD OF GROWING DIAMOND THIN FILM

(71) Applicant: National Chiao Tung University, Hsinchu (TW)

(72) Inventors: Li Chang, Hsinchu (TW); Yu-Chang Chen, Hsinchu (TW); Jr-Yu Chen, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 387 days.

(21) Appl. No.: 13/953,315

(22) Filed: Jul. 29, 2013

(65) Prior Publication Data

US 2014/0209014 A1 Jul. 31, 2014

(30) Foreign Application Priority Data

Jan. 25, 2013 (TW) .............................. 102102787 A

(51) Int. Cl.
*C30B 29/04* (2006.01)
*C30B 25/18* (2006.01)
*C30B 25/06* (2006.01)
*C30B 25/10* (2006.01)

(52) U.S. Cl.
CPC .............. *C30B 25/183* (2013.01); *C30B 25/06* (2013.01); *C30B 25/10* (2013.01); *C30B 25/105* (2013.01); *C30B 25/186* (2013.01); *C30B 29/04* (2013.01)

(58) Field of Classification Search
CPC ........ C30B 23/02; C30B 23/04; C30B 25/02; C30B 25/18; C30B 29/04
See application file for complete search history.

(56) References Cited

U.S. PATENT DOCUMENTS

| | | | | |
|---|---|---|---|---|
| 5,236,545 A * | 8/1993 | Pryor | ...................... | C30B 25/02 117/929 |
| 5,501,877 A * | 3/1996 | Adair | ...................... | C23C 16/02 423/446 |
| 6,666,916 B2 * | 12/2003 | Fellbaum | ................ | C23C 16/01 117/101 |
| 6,872,127 B2 * | 3/2005 | Lin | ......................... | B24B 53/12 451/443 |

OTHER PUBLICATIONS

Yu-Chang Chen, "The Study of Diamond Growth on AlN/Si Substrate," Thesis National Chiao Tung University, p. 1 (Jul. 30, 2012).

* cited by examiner

*Primary Examiner* — Robert M Kunemund
(74) *Attorney, Agent, or Firm* — Muncy, Geissler, Olds & Lowe, P.C.

(57) ABSTRACT

The present invention is directed to a method of growing thin film diamond. Since there are micro-grooves formed between internal grains of the heterogeneous substrate during lateral epitaxy growth, diamond seeds are allowed to be embedded in the micro-grooves; surface damage caused by scratching method or seeding method also can be prevented. As a result, a continuous diamond thin film with uniform thickness and high quality can be obtained.

23 Claims, 3 Drawing Sheets

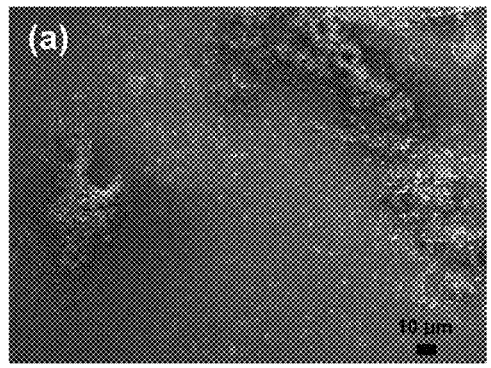
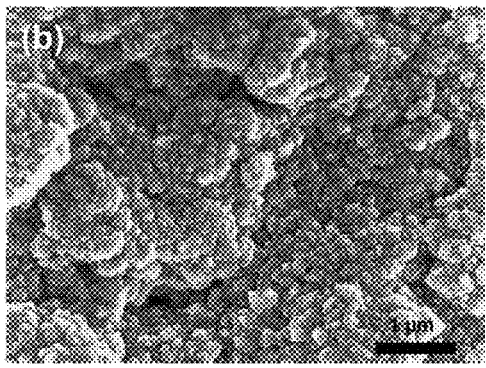
Fig. 2a                                         Fig. 2b
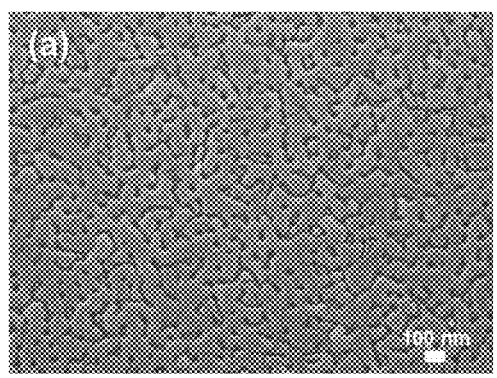
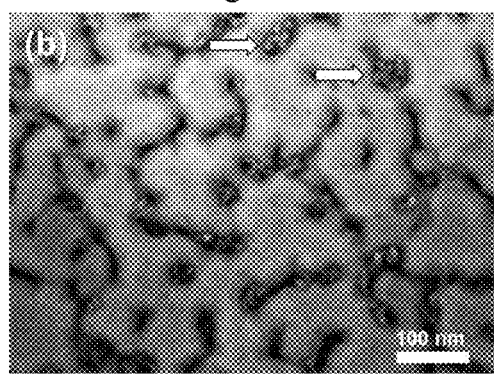
Fig. 3a                                         Fig. 3b
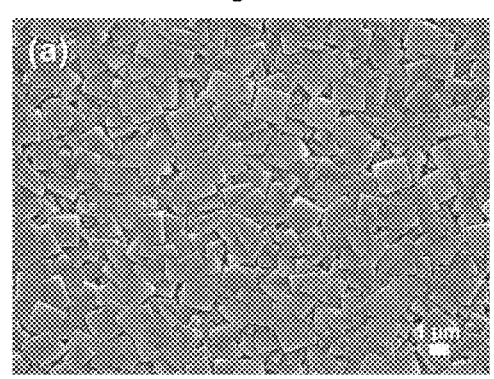
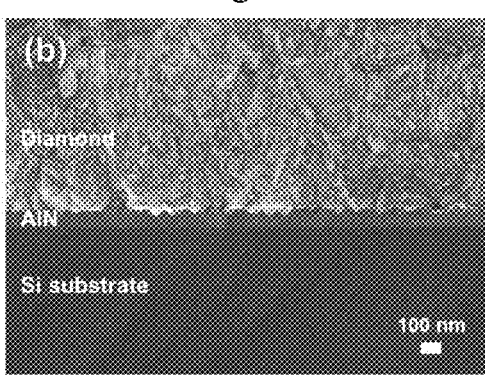
Fig. 4a                                         Fig. 4b

METHOD OF GROWING DIAMOND THIN FILM

BACKGROUND OF THE INVENTION

1. Field of the Invention

The present invention relates to a method of growing diamond thin film, and more particularly to a method of growing diamond thin film on a heterogeneous substrate.

2. Description of the Prior Art

Diamond is considered ideal thermal dissipation materials and high frequency materials due to its high thermal conductivity. For example, it can be applied to high electron mobility transistors (HEMTs). A diamond film deposited on a heterogeneous substrate made of nitrides such as AlN/GaN or InAlN/GaN can act as a heat dissipation layer to transfer heat out of the electronic device. However, nitride substrates such as AlN or InAlN having flat surface makes it difficult for diamond nucleation; this phenomenon has been reported in recent years. To solve this problem, rough surface of nitride substrate is usually formed by sputtering which provides more nucleation sites. Furthermore, it can be coordinated with scratching or seeding method to increase nucleation density. Nevertheless, it causes surface damage to the substrates, uneven distribution of nucleation sites, uneven thickness and rough surface of diamond films. These problems restrict industrial application of diamond.

According to conventional method of growing diamond thin film, a specimen of aluminum nitride is immersed into suspension fluid containing diamond powder for ultrasonic vibration for a period of time to generate scratches. Meanwhile, diamond powder is also embedded into scratches or absorbed on the surface of aluminum nitride to become nucleation sites. It could be seen that there is uneven distribution of diamond seeds and agglomeration of diamond power occurs on the surface of the specimen as shown in FIG. 2a. After pretreatments, a continuous diamond thin film is formed by microwave plasma chemical vapor deposition method (MPCVD). Results are shown in FIG. 2b and surface of diamond film appears cauliflower-like, which is rough and irregular.

If nucleation density of diamond on the heterogeneous substrate can be increased without damaging the substrate (e.g. group III-nitride substrate) and continuous diamond film with uniform thickness and high flatness can be further obtained, wide application of diamond can be achieved.

SUMMARY OF THE INVENTION

The present invention is directed to a method of growing thin film diamond. Since there are micro-grooves formed between internal grains of the heterogeneous substrate during lateral epitaxy growth, diamond seeds are allowed to be embedded in the micro-grooves; surface damage caused by scratching method or seeding method also can be prevented. As a result, a continuous diamond thin film with uniform thickness and high quality can be obtained.

According to one embodiment of the present invention, a method of growing thin film diamond comprises: providing a carrier substrate; forming a heterogeneous substrate on the carrier substrate via epitaxial growth, wherein the heterogeneous substrate comprises multiple grains and there are multiple irregular micro-grooves formed at junction between the multiple grains on a upper surface of the heterogeneous substrate; providing multiple diamond seeds embedded into the multiple micro-grooves; and depositing a diamond thin film on the upper surface of the heterogeneous substrate.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein:

FIG. 2a is a SEM (scanning electron microscope) micrograph displaying distribution of diamond seeds on the heterogeneous substrate according to conventional methods;

FIG. 2b is a SEM micrograph showing the surface morphology of the diamond thin film after growth according to conventional methods;

FIG. 3a is a SEM micrograph displaying distribution of micro-grooves on the heterogeneous substrate according to one embodiment of the present invention;

FIG. 3b is a SEM micrograph showing the surface morphology of the diamond thin film according to one embodiment of the present invention, where the diamond seeds are embedded into the micro-grooves of the diamond thin film;

FIG. 4a is a SEM micrograph showing the surface morphology of the diamond thin film after growth according to one embodiment of the present invention;

FIG. 4b is a SEM micrograph showing cross-section of the diamond thin film according to one embodiment of the present invention;

DESCRIPTION OF THE PREFERRED EMBODIMENT

The detailed explanation of the present invention is described as follows. The described preferred embodiments are presented for purposes of illustrations and description, and they are not intended to limit the scope of the present invention.

Figure 1A:
FIG. 1a to FIG. 1f are flowcharts showing the method of growing thin film diamond according to one embodiment of the present invention.

Referring to FIG. 1a to 1f, these are flowcharts displaying the method of diamond thin film growth. The method comprises several steps as follows: providing a carrier substrate 10 (as shown in FIG. 1a); forming a heterogeneous substrate 20 on the carrier substrate 10 via epitaxial growth, wherein the heterogeneous substrate 20 comprises multiple grains 21 and there are multiple irregular micro-grooves 22 formed at junction between the multiple grains 21 on a upper surface 23 of the heterogeneous substrate 20; providing multiple diamond seeds S embedded into the multiple micro-grooves 22; and depositing a diamond thin film 30 on the upper surface 23 of the heterogeneous substrate 20. The "heterogeneous" substrate presented here means that the diamond thin film 30 is deposited on a non-diamond substrate.

Figure 1B:
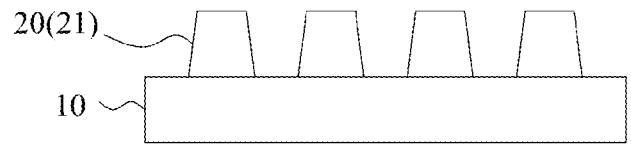
Figure 1C:
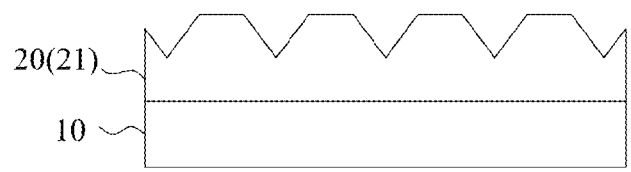
Figure 1D:
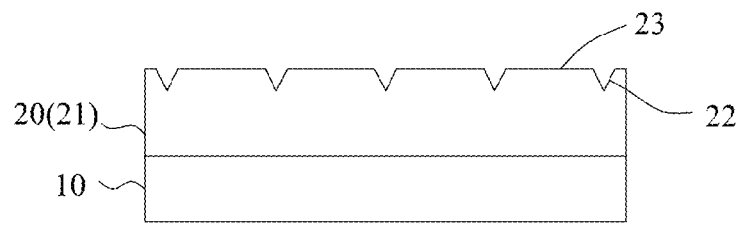
Figure 1E:
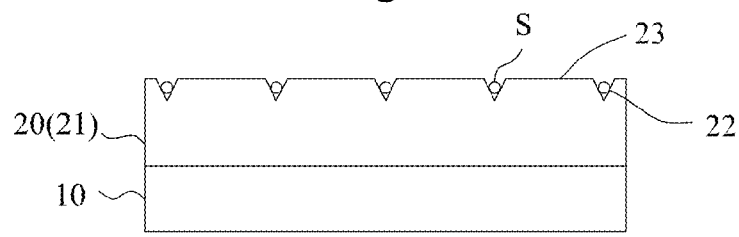
Figure 1F:
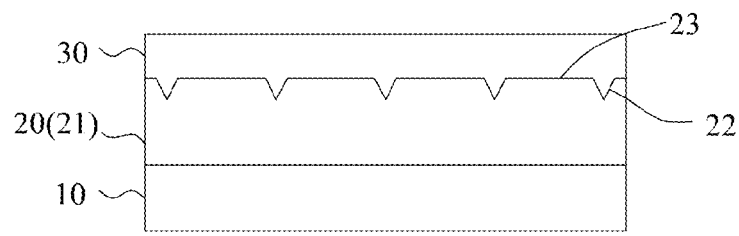

Referring to FIG. 1a to 1f, according to an embodiment of the present invention, the mechanism of growing the heterogeneous substrate 20 via epitaxial growth is described as follows. First, the multiple grains 21 having island-like structure are formed on the carrier substrate 10 (as shown in FIG. 1b) and then multiple grains 21 commence to grow upwards and laterally, where the multiple grains 21 gradually contact to each other during lateral growth to form an epitaxial layer (as shown in FIGS. 1c and 1d). In one embodiment, the heterogeneous substrate 20 is formed on the carrier substrate 10 by metal organic chemical vapor deposition method (MOCVD). After growing for a period of time, because some of the multiple grains 21 do not fully contact to each other, there are multiple irregular micro-grooves 22 formed within the space between the multiple grains 21 on the upper surface 23 of the heterogeneous substrate 20. These micro-grooves 22 can be distributed uniformly over the upper surface 23 of the heterogeneous substrate 20 (as shown in FIG. 3a) to let the diamond seeds S embedded into the micro-grooves 22. (as shown in FIG. 3b). Owing to uniform distribution of the micro-grooves 22 on the upper surface 23 of the heterogeneous substrate 20, the diamond seeds S also can be distributed uniformly. Besides, the micro-grooves 22 are naturally formed during crystal growth but not generated in a destructive way (e.g. scratching method), it does not cause damage to the heterogeneous substrate 20 and thus reduce inhomogeneous distribution of the diamond seeds S over the upper surface 23 of the heterogeneous substrate 20. As a consequence, the diamond thin film 30 having uniform thickness, better flatness, good quality and continuous film can be obtained. In addition to MOCVD, the heterogeneous substrate 20 also can be deposited on the carrier substrate 10 by molecular beam epitaxy growth method (MBE), sputtering method or pulse laser deposition method (PLD).

Regarding selection of materials, referring to FIG. 1a to 1f, the carrier substrate 10 and the heterogeneous substrate 20 can be composed of the same materials. The carrier substrate 10 can be selected from one of a silicon substrate, a silicon carbide substrate, an aluminum oxide substrate, an aluminum nitride (AlN) substrate, and a gallium nitride (GaN) substrate, where the silicon substrate can be {110} silicon substrate or {111} silicon substrate in cubic crystal system; the aluminum oxide substrate can be a c-plane aluminum oxide substrate, a m-plane aluminum oxide substrate, an a-plane aluminum oxide substrate or a r-plane aluminum oxide substrate. These are conventional materials of substrates applied in CVD. Accordingly, the heterogeneous substrate 20 growing on the carrier substrate 10 can be epitaxy belonging to cubic crystal system, for example, {100} epitaxy, {111} epitaxy or {110} epitaxy; it also can be c-plane epitaxy ({0001}), m-plane epitaxy ({10-10}), a-plane epitaxy ({11-20}), r-plane epitaxy ({10-12}) or semipolar epitaxy (e.g. {10-11}, {11-22} or {10-13}) in hexagonal crystal system.

Traditionally, the diamond thin film 30 usually grows on the heterogeneous substrate 20, where materials of the heterogeneous substrate 20 can be nitrides selected from binary nitrides, ternary nitrides and quaternary nitrides. In one embodiment, they comprise at least one of aluminum, gallium and indium or any combination thereof. For instance, the binary nitrides comprises aluminum nitride (AlN); indium nitride (InN), or gallium nitride (GaN), and the ternary nitrides comprise aluminum gallium nitride, aluminum indium nitride, or gallium indium nitride, and the quaternary nitrides comprise aluminum gallium indium nitride. Preferably, the heterogeneous substrate 20 is an aluminum nitride (AlN) substrate. In addition to the nitride substrate, other substrates which have micro-grooves on the surface for diamond seeds, to be embedded in are adequate for the heterogeneous substrate 20. In one embodiment, the heterogeneous substrate 20 is selected from a metal substrate, a ceramic substrate, a group IV compound substrate, a group III-V compound substrate, a group II-VI compound substrate and a group IV substrate.

With respect to the crystal structure of the diamond thin film 30 deposited on the upper surface 23 of the heterogeneous substrate 20, it can be single crystal or polycrystalline. The diamond thin film 30 can be epitaxy growing on the heterogeneous substrate 20. As for the surface morphology, the diamond thin film 30 can have a preferred orientation of <100>, <110>, or <111>.

On the other hand, according to one embodiment and referring to FIG. 1a to FIG. 1f, the way to provide multiple diamond seeds S is by immersing the heterogeneous substrate 20 into a suspension fluid containing multiple diamond seeds S for ultrasonic vibration so as to let the multiple diamond seeds S embedded into the multiple micro-grooves 22. Ultrasonic vibration performed here is to distribute diamond seeds S homogeneously but not for generating scratches. Hence, it requires shorter time of vibration. While the diamond seeds S are imbedded into the micro-grooves 22, agglomerates of the diamond seeds S may be generated on the upper surface 23 of the heterogeneous substrate 20. In one embodiment, the dimension of the multiple diamond seeds S is smaller than that of the micro-grooves 22 so that agglomerates with excessive size cannot move into the micro-grooves 22. Advantageously, the dimension of the diamond seeds S can be maintained uniform and benefits grain growth with average size. In one embodiment, the dimension of the multiple micro-grooves 22 is micron-scale, submicron-scale or nano-scale. Preferably, the dimension of the multiple micro-grooves 22 is less than 100 nanometers. Size of the micro-grooves 22 and the diamond seeds S can be formed or selected according to users' requirements.

In a preferred embodiment, the method of growing the thin film diamond further comprises using a cleaning fluid to clean the heterogeneous substrate 20 after providing multiple diamond seeds S embedded into the multiple micro-grooves 22 so as to remove multiple agglomerates of the multiple diamond seeds S formed on the upper surface 23 of the heterogeneous substrate 20. The clean fluid comprises at least one of water, ethanol, methanol, and acetone.

The diamond thin film 30 can be deposited on the upper surface 23 of the heterogeneous substrate 20 by microwave plasma chemical vapor deposition method (MPCVD), hot filament chemical vapor deposition method, plasma enhanced chemical vapor deposition method (PECVD), low-pressure chemical vapor deposition method or DC plasma enhanced chemical vapor deposition method. A process gas also can be provided when the diamond thin film 30 is deposited on the upper surface 23 of the heterogeneous substrate 20. The process gas comprises at least one of hydrogen, argon, carbon monoxide, carbon dioxide, alkanes, alkenes, and alkynes.

Preferred embodiments are described as follows for better explanation but not to limit the present invention.

Embodiment I

An aluminum nitride (AlN) thin film is deposited on a silicon substrate by MOCVD. There are micro-grooves with the width of 30 to 40 nm uniformly distributed on the surface of the aluminum nitride (AlN) thin film, as shown in FIG. 3a. After that, the aluminum nitride specimen is placed into the suspension fluid containing nano-diamonds for ultrasonic vibration and then cleaned by ethanol to remove agglomerates of nano-diamonds remained on the surface of the aluminum nitride thin film. As expected, only nano-diamond seeds embedded into the micro-grooves are left on the surface of the aluminum nitride, as marked by arrow in FIG. 3b.

Figure 5A:
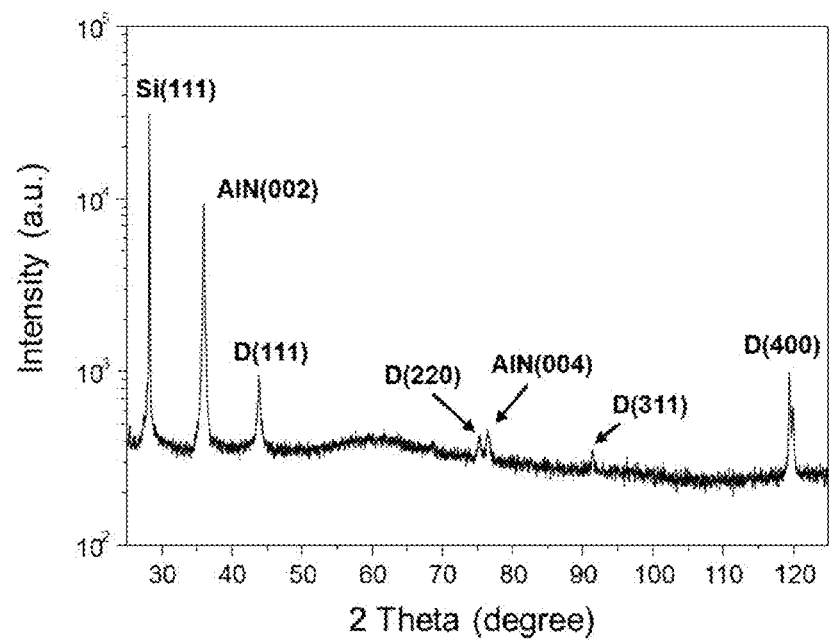
FIG. 5a is a diagram showing results of analyzing diamond thin film after growth by using a X-ray diffractometer according to one embodiment of the present invention.
Figure 5B:
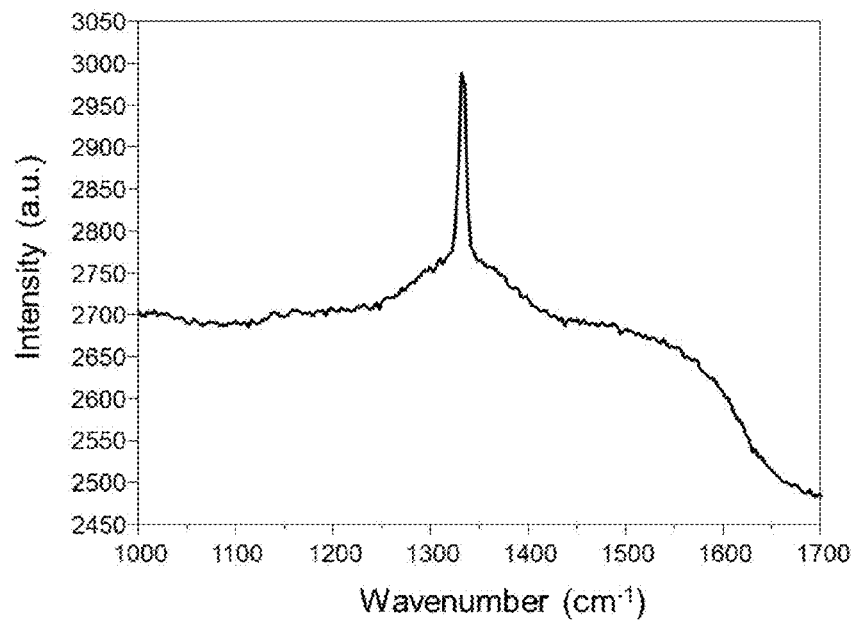
FIG. 5b is a diagram showing results of analyzing the diamond thin film by using Raman spectroscopy.

The above-mentioned AlN specimen is then treated with MPCVD for 4 hours to grow diamond thin film thereon. By applying appropriate parameters, a diamond film with thickness of 6 μm, which is well-attached to the heterogeneous substrate, is obtained. It has better flatness and uniform thickness comparing to the diamond thin film grown on a silicon substrate by applying the same conditions described before (as shown in FIG. 4a, 4b). More than this, nucleation rate and growth rate are also higher. Results of analyzing the diamond thin film by using X-ray diffractometer (as shown in FIG. 5a) and Raman spectroscopy (FIG. 5b, peak value of diamond is approx. 1332 $cm^{-1}$ to 1333 $cm^{-1}$) display that the diamond thin film has a preferred orientation of (100) and high purity of diamond structure. Comparing to the diamond thin film with cauliflower-like morphology (as shown in FIG. 2b), the growth method of the present invention can effectively deposit continuous diamond thin films with homogeneous thickness and flatness on AlN substrates (as shown in FIGS. 4a and 4b).

In conclusion, the present invention provides a method of growing thin film diamond. Since there are micro-grooves formed between internal grains of the heterogeneous substrate during lateral epitaxy growth, diamond seeds are allowed to be embedded in the micro-grooves; surface damage caused by scratching method or seeding method also can be prevented. As a result, a continuous diamond thin film with uniform thickness and high quality can be obtained.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A growth method of diamond thin film comprising:
providing a carrier substrate;
forming a heterogeneous substrate on the carrier substrate via epitaxial growth, wherein the heterogeneous substrate comprises multiple grains and there are multiple irregular micro-grooves formed at junction between the multiple grains on a upper surface of the heterogeneous substrate;
providing multiple diamond seeds embedded into the multiple micro-grooves; and
depositing a diamond thin film on the upper surface of the heterogeneous substrate.

2. The growth method of diamond thin film according to claim 1, wherein the heterogeneous substrate is immersed into a suspension fluid containing the multiple diamond seeds for ultrasonic vibration so as to make the multiple diamond seeds embedded into the multiple micro-grooves.

3. The growth method of diamond thin film according to claim 1 further comprising using a cleaning fluid to clean the heterogeneous substrate after providing multiple diamond seeds embedded into the multiple micro-grooves so as to remove multiple agglomerates of the multiple diamond seeds formed on the upper surface of the heterogeneous substrate.

4. The growth method of diamond thin film according to claim 3, wherein the cleaning fluid comprises at least one of water, ethanol, methanol, and acetone.

5. The growth method of diamond thin film according to claim 1, wherein the carrier substrate and the heterogeneous substrate are composed of the same materials.

6. The growth method of diamond thin film according to claim 1, wherein the carrier substrate is selected from one of a silicon substrate, a silicon carbide substrate, a aluminum oxide substrate, a aluminum nitride substrate, and a gallium nitride substrate.

7. The growth method of diamond thin film according to claim 6, wherein the silicon substrate is a {100} silicon substrate, a {110} silicon substrate or a {111} silicon substrate.

8. The growth method of diamond thin film according to claim 6, wherein the aluminum nitride substrate is c-plane aluminum nitride, m-plane aluminum nitride, a-plane aluminum nitride and r-plane aluminum nitride.

9. The growth method of diamond thin film according to claim 1, wherein the materials of the heterogeneous substrate is selected from binary nitrides, ternary nitrides, and quaternary nitrides.

10. The growth method of diamond thin film according to claim 9, wherein the binary nitrides, the ternary nitrides, and the quaternary nitrides comprise at least one of aluminum, gallium, indium.

11. The growth method of diamond thin film according to claim 9, wherein the binary nitrides comprises aluminum nitride, indium nitride, or gallium nitride, and the ternary nitrides comprise aluminum gallium nitride, aluminum indium nitride, or gallium indium nitride, and the quaternary nitride comprise aluminum gallium indium nitride.

12. The growth method of diamond thin film according to claim 1, wherein the heterogeneous substrate is an aluminum nitride substrate.

13. The growth method of diamond thin film according to claim 1, wherein the heterogeneous substrate is selected from a metal substrate, a ceramic substrate, a group IV compound substrate, a group III-V compound substrate, a group II-VI compound substrate and a group IV substrate.

14. The growth method of diamond thin film according to claim 1, wherein the heterogeneous epitaxy is c-plane epitaxy, m-plane epitaxy, a-plane epitaxy or semipolar epitaxy.

15. The growth method of diamond thin film according to claim 1, wherein the heterogeneous substrate is {100}, {111} or {110} epitaxy.

16. The growth method of diamond thin film according to claim 1, wherein the diamond thin film is single crystal or polycrystalline.

17. The growth method of diamond thin film according to claim 1, wherein the diamond thin film has a preferred orientation of <100>, <110> or <111>.

18. The growth method of diamond thin film according to claim 1, wherein the size of the multiple diamond seeds is smaller than that of the multiple micro-grooves.

19. The growth method of diamond thin film according to claim 1, wherein the dimension of the multiple micro-grooves is micron-scale, submicron-scale or nano-scale.

20. The growth method of diamond thin film according to claim 1, wherein the dimension of the multiple micro-grooves is less than 100 nanometers.

21. The growth method of diamond thin film according to claim 1, wherein the heterogeneous substrate is formed by metal organic chemical vapor deposition method, molecular beam epitaxy growth method, sputtering method, or pulse laser deposition method.

22. The growth method of diamond thin film according to claim 1, wherein the diamond thin film is deposited on the upper surface of the heterogeneous substrate by microwave plasma chemical vapor deposition method, hot filament chemical vapor deposition method, plasma enhanced chemical vapor deposition method, low-pressure chemical vapor deposition method or DC plasma enhanced chemical vapor deposition method.

23. The growth method of diamond thin film according to claim 1, wherein a process gas is provided when the diamond thin film is deposited on the upper surface of the heterogeneous substrate, wherein the process gas comprises at least one of hydrogen, argon, carbon monoxide, carbon dioxide, alkanes, alkenes, and alkynes.

\* \* \* \* \*